United States Patent
Liu et al.

(10) Patent No.: US 9,337,349 B2
(45) Date of Patent: May 10, 2016

(54) THIN FILM TRANSISTOR WITH A RING-SHAPED HOLE OF A STOPPER LAYER AND PIXEL STRUCTURE HAVING THE THIN FILM TRANSISTOR

(71) Applicant: Chunghwa Picture Tubes, LTD., Taoyuan (TW)

(72) Inventors: En-Chih Liu, Taoyuan County (TW); Ying-Hui Chen, Taoyuan County (TW); Yen-Yu Huang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 42 days.

(21) Appl. No.: 14/339,462

(22) Filed: Jul. 24, 2014

(65) Prior Publication Data
US 2015/0325706 A1 Nov. 12, 2015

(30) Foreign Application Priority Data
May 9, 2014 (TW) .............................. 103208134 U

(51) Int. Cl.
| | |
|---|---|
| *H01L 29/66* | (2006.01) |
| *H01L 21/441* | (2006.01) |
| *H01L 29/786* | (2006.01) |

(52) U.S. Cl.
CPC .... *H01L 29/78693* (2013.01); *H01L 29/78696* (2013.01)

(58) Field of Classification Search
CPC . H01L 27/1214; H01L 27/12; H01L 29/4908; H01L 29/66765; H01L 27/088; H01L 29/788; H01L 31/0735
USPC .......................................................... 257/59
See application file for complete search history.

(56) References Cited

U.S. PATENT DOCUMENTS

| | | | | |
|---|---|---|---|---|
| 7,800,109 | B2 * | 9/2010 | Tsao et al. | H01L 29/4908 257/347 |
| 2006/0046335 | A1 * | 3/2006 | Sarma et al. | H01L 29/458 438/30 |
| 2013/0264564 | A1 * | 10/2013 | Park et al. | H01L 29/66742 257/43 |
| 2015/0179809 | A1 * | 6/2015 | Liu et al. | H01L 29/78606 257/72 |

FOREIGN PATENT DOCUMENTS

| | | | | |
|---|---|---|---|---|
| CN | WO 2014146380 A1 * | 9/2014 | | H01L 29/78606 |
| TW | 201251026 | 12/2012 | | |

* cited by examiner

*Primary Examiner* — Thomas L Dickey
*Assistant Examiner* — Damon Hillman
(74) *Attorney, Agent, or Firm* — Jianq Chyun IP Office

(57) ABSTRACT

A thin film transistor including a gate, a channel, a stopper layer, a source and a drain is provided. The channel and the gate are overlapped. The stopper layer covers a portion of the channel and has a ring-shape hole exposing two opposite connecting portions of the channel. A portion of the stopper layer is disposed between the source and the channel and between the drain and the channel. The source and the drain are filled in the ring-shape hole of the stopper layer and electrically connected to the connecting portions of the channel. Moreover, a pixel structure including the thin film transistor is provided.

7 Claims, 7 Drawing Sheets

THIN FILM TRANSISTOR WITH A RING-SHAPED HOLE OF A STOPPER LAYER AND PIXEL STRUCTURE HAVING THE THIN FILM TRANSISTOR

CROSS-REFERENCE TO RELATED APPLICATION

This application claims the priority benefit of Taiwan application serial no. 103208134, filed on May 9, 2014. The entirety of the above-mentioned patent application is hereby incorporated by reference herein and made a part of this specification.

BACKGROUND OF THE DISCLOSURE

1. Field of the Invention

The invention is related to an electronic device, and more particularly to a thin film transistor and a pixel structure.

2. Description of Related Art

With the development of display technology, high-resolution display panels have become mainstream in display products nowadays. To fabricate a display panel having high resolution, the area occupied by each pixel structure needs to be reduced, and in consideration of the transmittance of the display panel, the area in each pixel structure occupied by a thin film transistor needs to be as small as possible, so as to enhance an aperture ratio of the display panel.

In conventional technology, the thin film transistor is disposed on a substrate and includes a gate, a channel, a stopper layer covering the channel, a source and a drain, wherein the stopper layer is for protecting the channel, so that the channel is not easily damaged in the process of etching a conductive layer to form the source and the drain. In terms of the types of patterns, the stopper layer is divided into a nearly-complete coverage type and an island-coverage type. A nearly-complete coverage stopper layer is to dispose two independent contact holes merely at two spots corresponding to the source and the drain, so that the source and the drain are filled in the two contact holes and electrically connected to the channel; at other spots, the nearly-complete coverage stopper layer nearly completely covers the whole substrate. The disadvantage of the thin film transistor adopting the nearly-complete coverage stopper layer is that the area corresponding to the two independent contact holes needs to be reserved on the channel, which makes it difficult to reduce the area occupied by the channel (or the area occupied by the thin film transistor). The island-coverage stopper layer is to dispose an island-shaped stopper pattern merely above the corresponding channel center without any stopper pattern in other spots. The disadvantage of the thin film transistor adopting the island-coverage stopper layer is that in the process of etching an insulated layer for forming the island-shaped stopper pattern, since the area of the insulated layer to be removed is larger, the processing time for forming the island-shaped stopper pattern is long and processing parameters are not easily adjusted, which leads easily to the issue that the whole insulated layer is removed without forming the island-shaped stopper layer.

SUMMARY OF THE INVENTION

A thin film transistor and a pixel structure are provided, which have small area and high yield rate in the fabricating process.

The thin film transistor of the invention includes a gate, a channel, a stopper layer, a source and a drain. The channel and the gate are overlapped. The stopper layer covers a portion of the channel and has a ring-shaped hole. The ring-shaped hole exposes two opposite connecting portions of the channel. A portion of the stopper layer is disposed between the source and the channel and between the drain and the channel. The source and the drain are filled in the ring-shape hole of the stopper layer and electrically connected to the connecting portions of the channel respectively.

The pixel structure of the invention includes the thin film transistor and a pixel electrode electrically connected to the drain of the thin film transistor.

In an embodiment of the invention, the stopper layer includes a first stopper pattern and a second stopper pattern surrounding the first stopper pattern. The first stopper pattern overlaps with the gate and the channel. The first stopper pattern and the second stopper pattern are separated to define the ring-shaped hole.

In an embodiment of the invention, the source and the drain extend from the second stopper pattern onto the first stopper pattern.

In an embodiment of the invention, the thin film transistor is arranged on a substrate. The channel has a top surface facing the stopper layer and parallel to the substrate, a bottom surface opposite from the top surface and parallel to the substrate and a side surface between the top surface and the bottom surface. The ring-shaped hole of the stopper layer exposes the side surface of the channel, and the source and the drain contact with the side surface of the channel.

In an embodiment of the invention, the thin film transistor is arranged on a substrate. The channel has a top surface facing the stopper layer and parallel to the substrate, a bottom surface opposite from the top surface and parallel to the substrate and a side surface between the top surface and the bottom surface. The stopper layer covers the side surface of the channel.

In an embodiment of the invention, the ring-shaped hole includes a rectangular-shaped hole.

In an embodiment of the invention, the material of the channel includes an amorphous silicon or a metal oxide semiconductor.

In an embodiment of the invention, the stopper layer includes a first stopper pattern and a second stopper pattern surrounding the first stopper pattern. The first stopper pattern overlaps with the gate and the channel. The second stopper pattern overlaps with the pixel electrode. The first stopper pattern and the second stopper pattern are separated to define the ring-shaped hole.

Based on the above, the thin film transistor and the pixel structure in an embodiment of the invention have the advantages of small area and high yield rate in the fabricating process by means of the design of the ring-shaped hole of the stopper layer.

In order to make the aforementioned and other features and advantages of the invention more comprehensible, several embodiments accompanied by figures are described in detail below.

BRIEF DESCRIPTION OF THE DRAWINGS

The accompanying figures are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
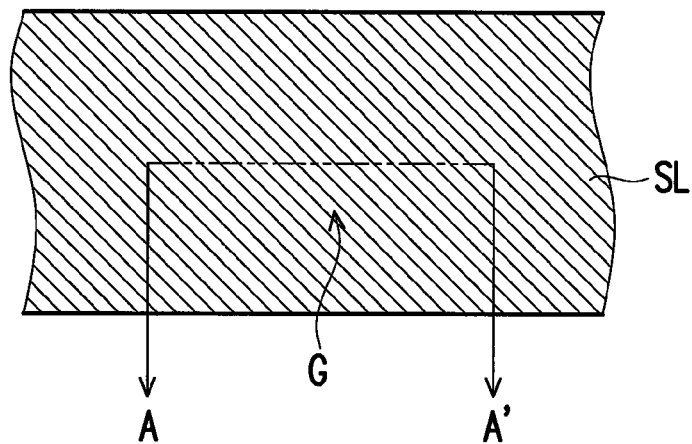
FIGS. 1A to 1F are schematic top views of a pixel structure in a process flow according to an embodiment of the invention.
Figure 2A:
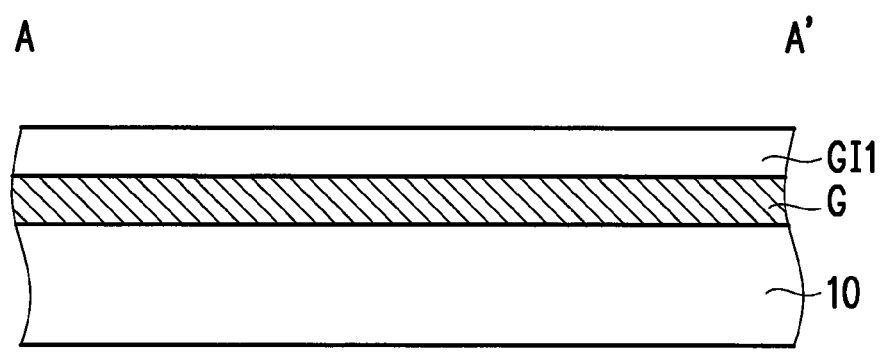
FIGS. 2A to 2F are schematic cross-sectional views corresponding respectively to a cutting line A-A' of the pixel structure in the process flow of FIGS. 1A to 1F.

FIGS. 1A to 1F are schematic top views of a pixel structure in a process flow in an embodiment of the invention. FIGS. 2A to 2F are schematic cross-sectional views corresponding respectively to a cutting line A-A' of the pixel structure in the process flow of FIGS. 1A to 1F. It should be noted that for the sake of clarity, a substrate 10 in FIGS. 2A to 2F is not illustrated in FIGS. 1A to 1F. Referring to FIGS. 1A and 2A, the substrate 10 (shown in FIG. 2A) is provided first. With respect to optical characteristics, the substrate 10 may be a light transmissive or non-transmissive/reflective substrate. The material of the light transmissive substrate may be selected from glass, quartz, organic polymers, other adequate materials or combinations thereof. The material of the non-transmissive/reflective substrate may be selected from conductive materials, metals, wafers, ceramics, other adequate materials or combinations thereof. It should be noted that if the conductive materials are selected for the substrate 10, an insulated layer (not shown) should be formed on the substrate 10 before the substrate 10 bears members of the pixel structure, so as to avoid the issue of short circuit between the substrate 10 and the members of the pixel structure. With respect to mechanical characteristics, the substrate 10 may be a rigid substrate or a flexible substrate. The material of the rigid substrate may be selected from glass, quartz, conductive materials, metals, wafers, ceramics, other adequate materials or combinations thereof. The material of the flexible substrate may be selected from extra-thin glass, organic polymers (such as plastics), other adequate materials or combinations thereof.

Next, a gate G is formed on the substrate 10. As shown in FIG. 1A, in this embodiment, a portion of a scan line SL may be used as the gate G, but the invention is not limited thereto. In other embodiments, the gate G may also be in other adequate forms, such as a conductive block extending outward from the scan line SL. The gate G is generally formed of metal materials, but the invention is not limited thereto. In other embodiments, the gate G may also use other conductive materials (such as an alloy, a nitride of metal materials, an oxide of metal materials, an oxynitride of metal materials) or a stacked layer of metal materials with other conductive materials. Then, a first insulated layer GI1 (shown in FIG. 2A) is formed. The material of the first insulated layer GI1 may be selected from inorganic materials (such as silicon oxide, silicon nitride, silicon oxynitride, other adequate materials or a stacked layer of at least two of the above materials), organic materials, other adequate materials or combinations thereof. In this embodiment, the first insulated layer GI1 may completely cover the gate G and the substrate 10, but the invention is not limited thereto. In other embodiments, the first insulated layer GI1 may also be in other adequate forms.

Figure 1B:
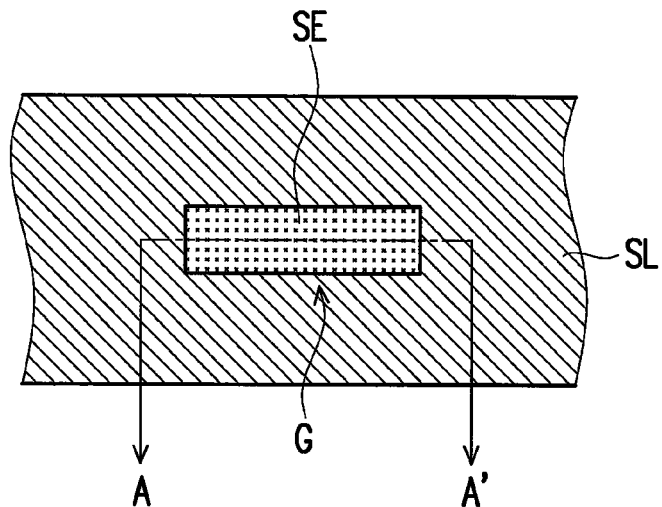
Figure 2B:
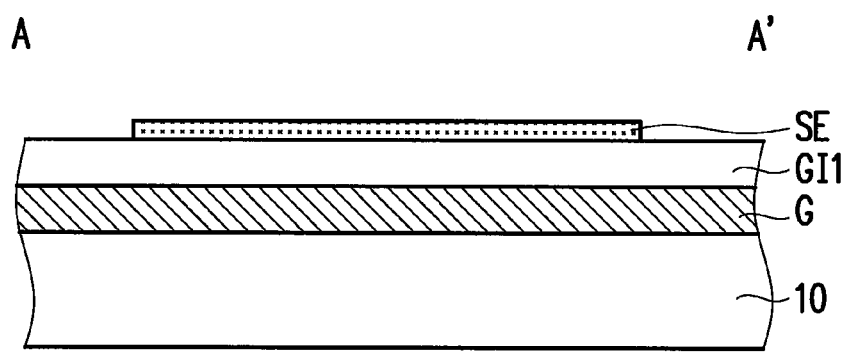

Referring to FIGS. 1B and 2B, a channel SE overlapping with the gate G is then formed on the first insulated layer GI1. In this embodiment, the channel SE may be a single-layer or multi-layer structure, and the material may be selected from amorphous silicon, polysilicon, microcrystalline silicon, monocrystalline silicon, metal oxide semiconductor materials [such as Indium-Gallium-Zinc Oxide (IGZO), ZnO, SnO, Indium-Zinc Oxide (IZO), Gallium-Zinc Oxide, (GZO), Zinc-Tin Oxide (ZTO), Indium-Tin Oxide (ITO)], other adequate materials or combinations thereof.

Figure 1C:
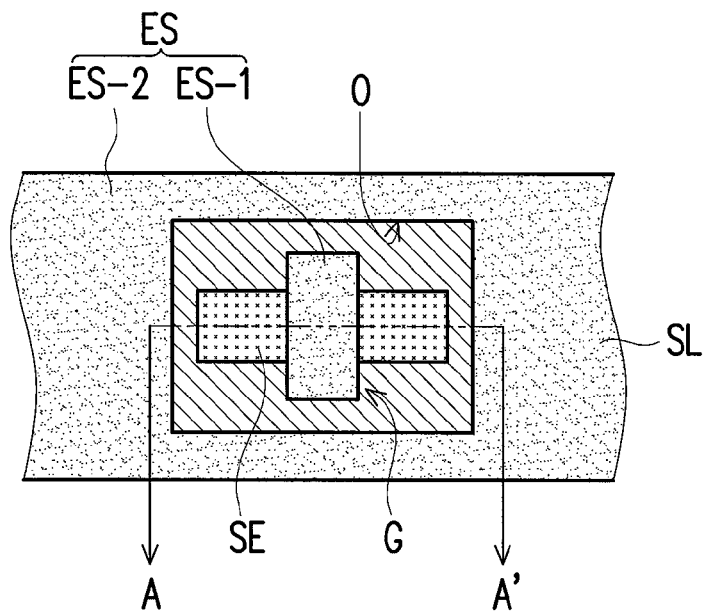
Figure 2C:
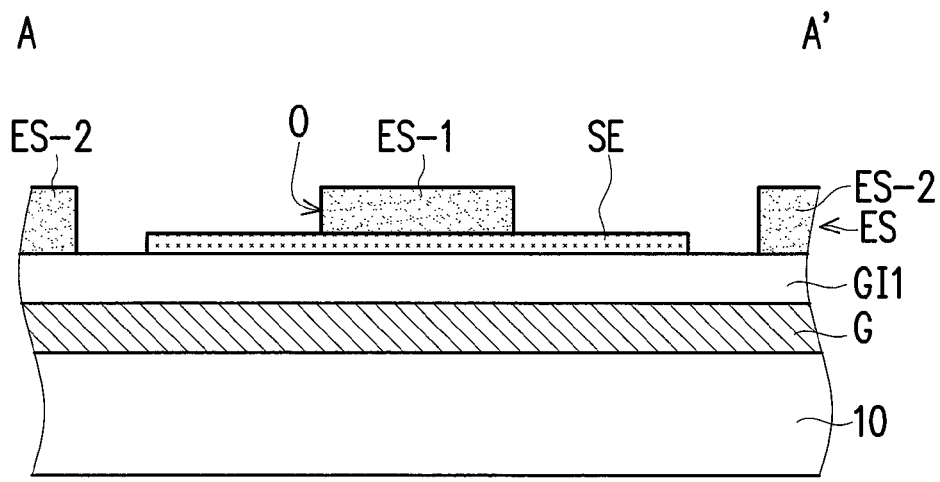

Referring to FIGS. 1C and 2C, a stopper layer ES is then formed on the channel SE and the first insulated layer GI1. The stopper layer ES covers a portion of the channel SE and has a ring-shaped hole O exposing two opposite connecting portions SE-1 and SE-2 of the channel SE. More particularly, in this embodiment, the stopper layer SE includes a first stopper pattern ES-1 and a second stopper pattern ES-2 surrounding the first stopper pattern ES-1. The first stopper pattern ES-1 and the second stopper pattern ES-2 are separated to define the ring-shaped hole O, wherein the first stopper pattern ES-1 covers a portion of the channel SE. The stopper layer ES is for protecting the channel SE therebelow so that the channel SE still maintains good semiconductor characteristics after a following etching process. Therefore, the stopper layer ES may also be called a channel protection layer. The material of the stopper layer ES may be silicon dioxide or other adequate materials.

Figure 1D:
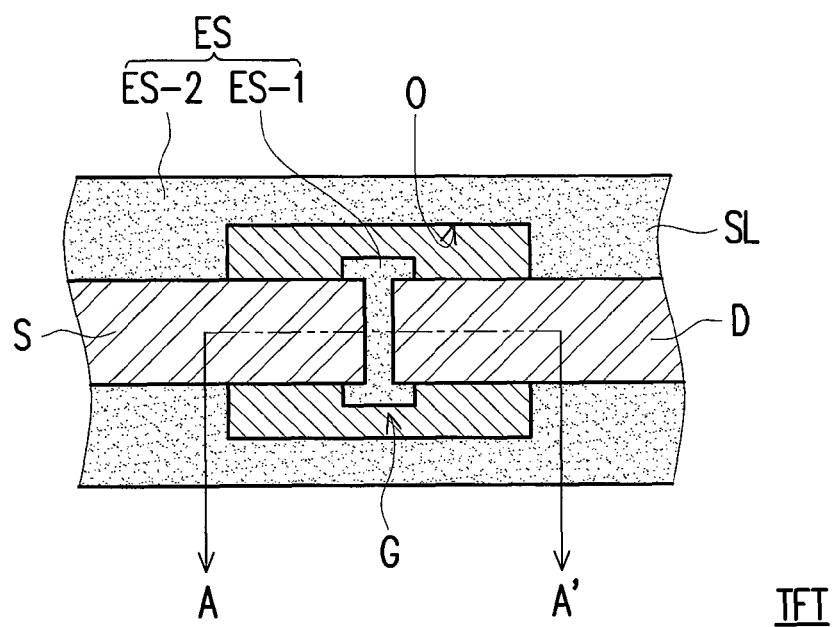
Figure 2D:
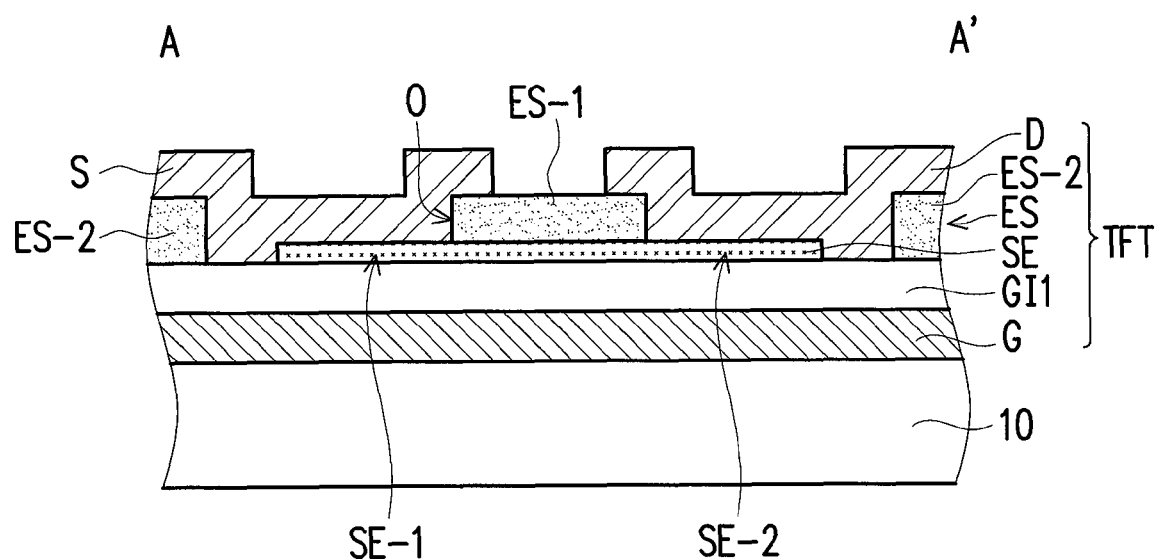

Referring to FIGS. 1D and 2D, a source S and a drain D are then formed on the channel SE simultaneously. The source S and the drain D are filled in the ring-shaped hole O of the stopper layer ES and electrically connected to the two connecting portions SE-1 and SE-2 (shown in FIG. 2D) of the channel SE. Now the thin film transistor TFT of the embodiment has been completed. The source S and the drain D are generally formed of metal materials, but the invention is not limited thereto. In other embodiments, the source S and the drain D may also use other conductive materials (such as an alloy, a nitride of metal materials, an oxide of metal materials, an oxynitride of metal materials) or a stacked layer of metal materials with other conductive materials.

Figure 1E:
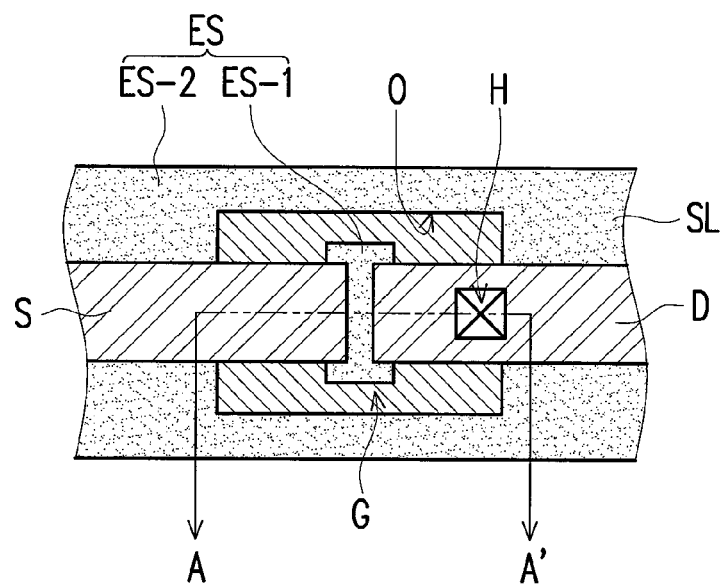
Figure 2E:
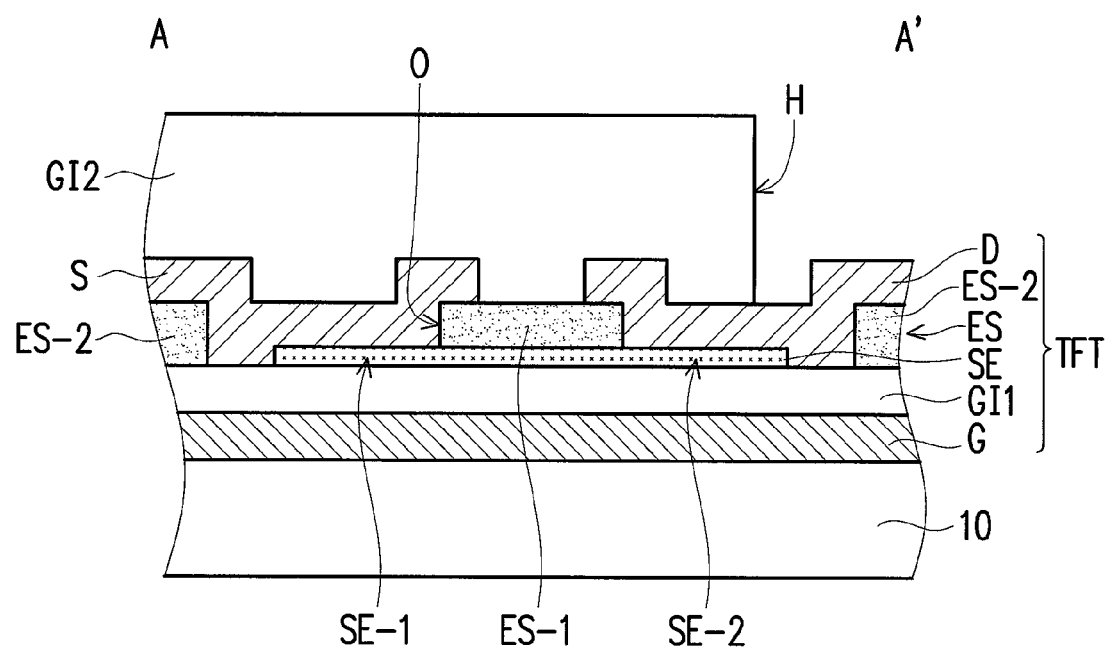

Referring to FIGS. 1E and 2E, a second insulated layer GI2 (shown in FIG. 2E) is then formed on the source S and the drain D selectively. The second insulated layer GI2 convers the source S, the stopper layer ES and a portion of the drain D. The second insulated layer GI2 has a contact hole H exposing the drain D. The material of the second insulated layer GI2 may be selected from an inorganic material (such as silicon oxide, silicon nitride, silicon oxynitride, other adequate materials or a stacked layer of at least two of the above materials), an organic material, other adequate materials or combinations thereof.

Figure 1F:
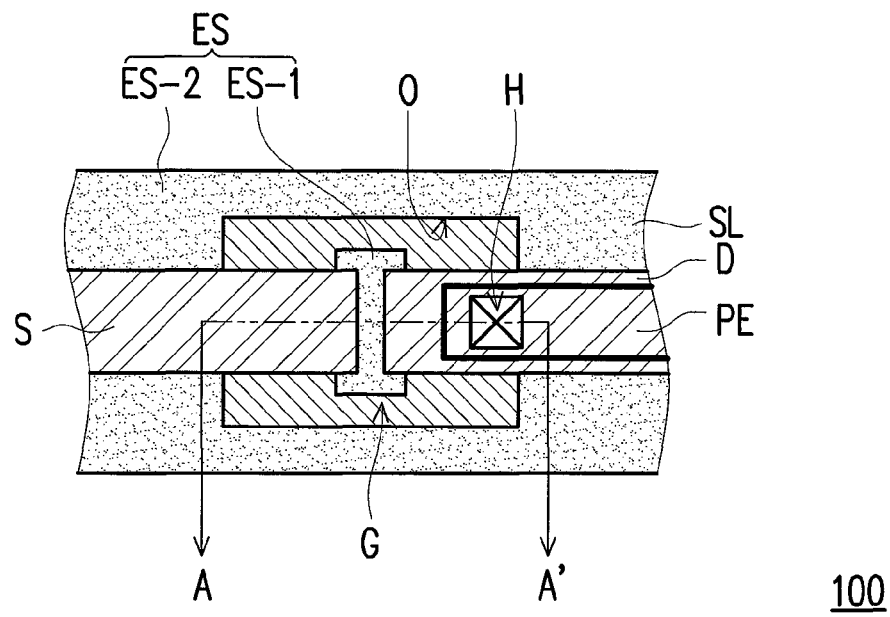
Figure 2F:
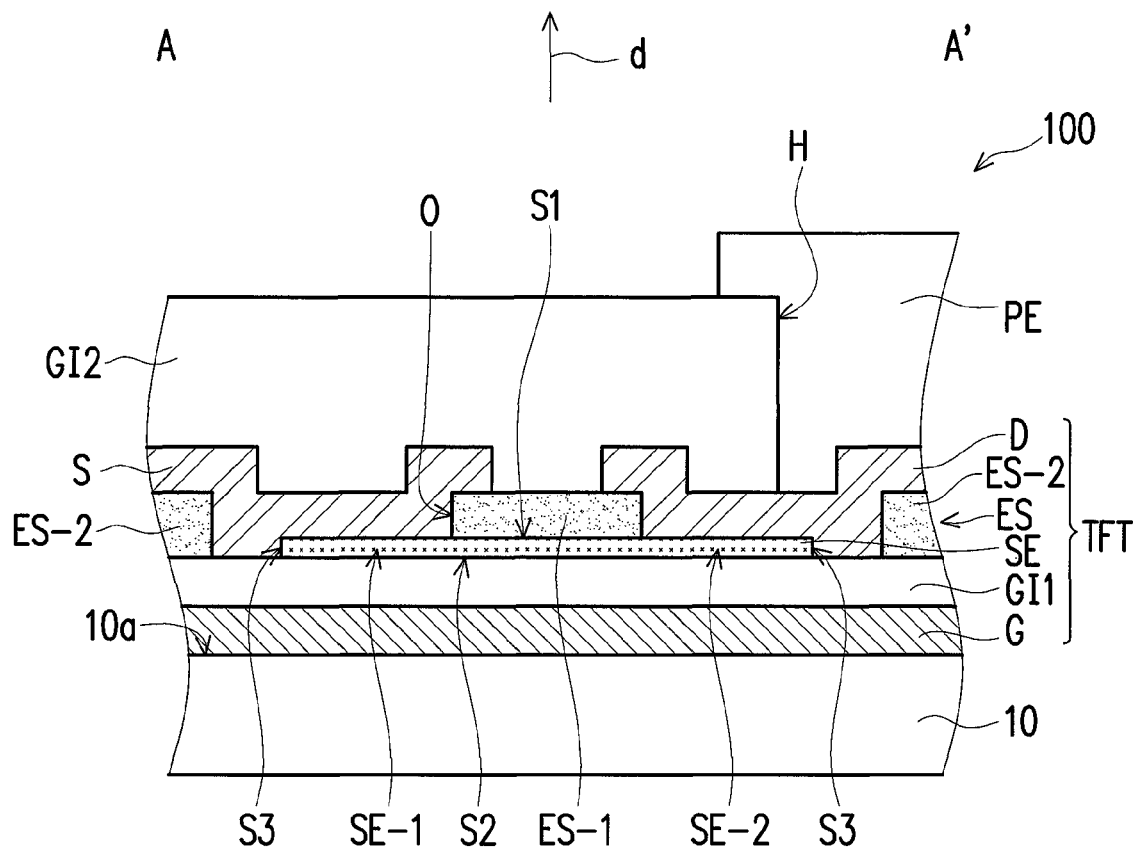

Referring to FIGS. 1F and 2F, a pixel electrode PE is then formed on the second insulated layer GI2 (shown in FIG. 2F). In this embodiment, the pixel electrode PE is filled in the contact hole H of the second insulated layer GI2 and electrically connected to the drain D. Now the pixel structure 100 of the embodiment has been completed. The pixel electrode PE may be designed as a transmissive pixel electrode, a reflective pixel electrode or a transflective pixel electrode according to actual needs. The material of the transmissive pixel electrode includes metal oxides such as an Indium-Tin oxide, an Indium-Zinc oxide, an Aluminum-Tin oxide, an Aluminum-Zinc oxide, an Indium-Germanium-Zinc oxide, other adequate oxides or a stacked layer of at least two of the above materials. The material of the reflective pixel electrode includes conductive materials having high reflectance, such as metals. The material of the transflective pixel electrode includes a combination of high-reflectance conductive materials and high light-transmittance conductive materials.

The pixel structure 100 is arranged on a bearing surface 10a (shown in FIG. 2F) of the substrate 10. The pixel structure 100 includes the thin film transistor TFT (shown in FIG. 2F) and the pixel electrode PE electrically connected to the drain D of the thin film transistor TFT. The thin film transistor TFT includes the gate G, the channel SE, the stopper layer ES, the source S and the drain D. The bearing surface 10a of the substrate 10 has a normal direction d (shown in FIG. 2F) passing through the gate G. More specifically, if the bearing surface 10a is a flat plane, the normal direction d refers to a direction perpendicular to the bearing surface 10a and passing through the gate G. If the bearing surface 10a is a curved plane, the normal direction d refers to a direction perpendicular to a reference tangent plane (not shown), wherein the reference tangent plane is tangent to the bearing surface 10a and passes through the location where the gate G is located.

The gate G and the channel SE are both arranged on the bearing surface 10a of the substrate 10. The channel SE and the gate G overlap in the normal direction d. In this embodiment, the gate G may be selectively arranged between the channel SE and the substrate 10. In other words, the gate G may be selectively disposed below the channel SE, so that the thin film transistor TFT is a Bottom-gate thin film transistor. However, the invention is not limited thereto. In other embodiments, the gate G may be selectively disposed above the channel SE, so that the thin film transistor TFT is a Top-gate thin film transistor. It should be noted that the form of the thin film transistor of the invention is not limited to the Bottom-gate type or the Top-gate type. In other embodiments, the thin film transistor may also be in other adequate forms.

In addition, the thin film transistor TFT in this embodiment may selectively include the first insulated layer GI1 (shown in FIG. 2G) arranged between the channel SE and the gate G. In this embodiment, the gate G may be arranged between the first insulted layer GI1 and the substrate 10. The first insulated layer GI1 may completely cover the gate G and the substrate 10 to present an unetched insulated pattern. However, the invention is not limited thereto. The position and pattern of the first insulated layer GI1 may both be designed otherwise to adequately match the actual needs.

The stopper layer ES covers a portion of the channel SE and exposes two opposite connecting portions SE-1 and SE-2 of the channel SE. In this embodiment, the channel SE is disposed between a portion of the stopper layer ES and the first insulated layer GI1. More specifically, the stopper layer ES has a ring-shaped hole O. The ring-shaped hole O exposes two opposite connecting portions SE-1 and SE-2 of the channel SE. In this embodiment, the ring-shaped hole O is, for example, a rectangular-shaped hole, but the invention is not limited thereto. In other embodiments, the ring-shaped hole O may also be in other adequate forms, such as a circular shape and an elliptic shape.

More specifically, in this embodiment, the stopper layer SE includes the first stopper pattern ES-1 and the second stopper pattern ES-2. The first stopper pattern ES-1 overlaps with the gate G and the channel SE in the normal direction d. The channel SE may be disposed between the first stopper pattern ES-1 and the first insulated layer GI1 and contact with the first stopper pattern ES-1. The second stopper pattern ES-2 overlaps with the pixel electrode PE in a direction parallel to the normal direction d. The first insulated layer GI1 may be disposed between the second stopper pattern ES-2 and the gate G and contact with the second stopper pattern ES-2. The second stopper pattern ES-2 surrounds the first stopper pattern ES-1. The first stopper pattern ES-1 and the second stopper pattern ES-2 are separated to define the ring-shaped hole O together. In other words, the first stopper pattern ES-1 is an island-shaped pattern covering the channel SE, while the second stopper pattern ES-2 is a pattern that surrounds the island-shaped pattern and has a large area. More particularly, in this embodiment, the second stopper pattern ES-2 almost completely covers the whole substrate 10 except the location where the channel SE is located and peripheral areas thereof. However, the invention is not limited thereto. In other embodiments, the second stopper pattern ES-2 may also be in other adequate forms, which are described with examples in the following paragraphs.

A portion of the stopper layer ES (such as the first stopper pattern ES-1) is disposed between the source S and the channel SE and between the drain D and the channel SE. The source S and the drain D are filled in the ring-shaped hole O of the stopper layer ES and electrically connected to the two connecting portions SE-1 and SE-2 of the channel SE. More particularly, in this embodiment, the source S and the drain D extend from the second stopper pattern ES-2 onto the first stopper pattern ES-1. When the source S and the drain D extend from the second stopper pattern ES-2 onto the first stopper pattern ES-1, the source S and the drain D directly cover the two connecting portions SE-1 and SE-2 of the channel SE respectively, and thereby electrically contact with the two connecting portions SE-1 and SE-2. However, the invention is not limited thereto. In other embodiments, the source S and the drain D may also be electrically connected to the two connecting portions SE-1 and SE-2 of the channel SE respectively via two ohmic contact patterns (not shown) or other adequate manners.

As shown in FIG. 2F, the channel SE has a top surface S1 facing the stopper layer ES and parallel to the substrate 10, a bottom surface S2 opposite from the top surface S1 and parallel to the substrate 10 and a side surface S3 disposed between the top surface S1 and the bottom surface S2. In this embodiment, the ring-shaped hole O of the stopper layer ES may selectively expose the side surface S3 of the channel SE. When the source S and the drain D are filled in the ring-shaped hole O of the stopper layer ES, the source S and the drain D contact with the side surface S3 of the channel SE. However, the invention is not limited thereto. In other embodiments, the source S and the drain D may also not contact with the side surface S3 of the channel SE, and relative position of the ring-shaped hole and other members of the pixel structure may also be designed otherwise. The following descriptions take FIGS. 3A and 3B for example.

Figure 3A:
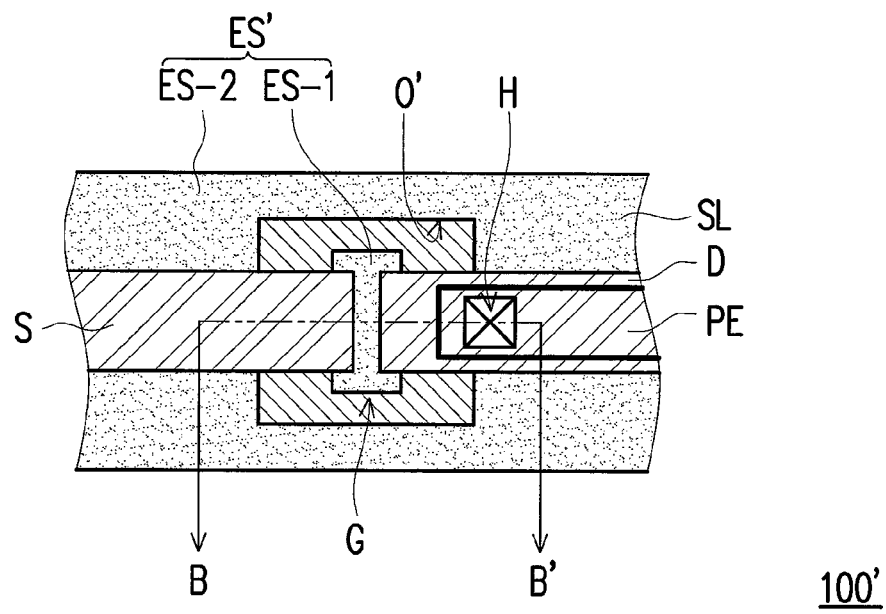
FIG. 3A is a schematic top view of a pixel structure according to another embodiment of the invention.
Figure 3B:
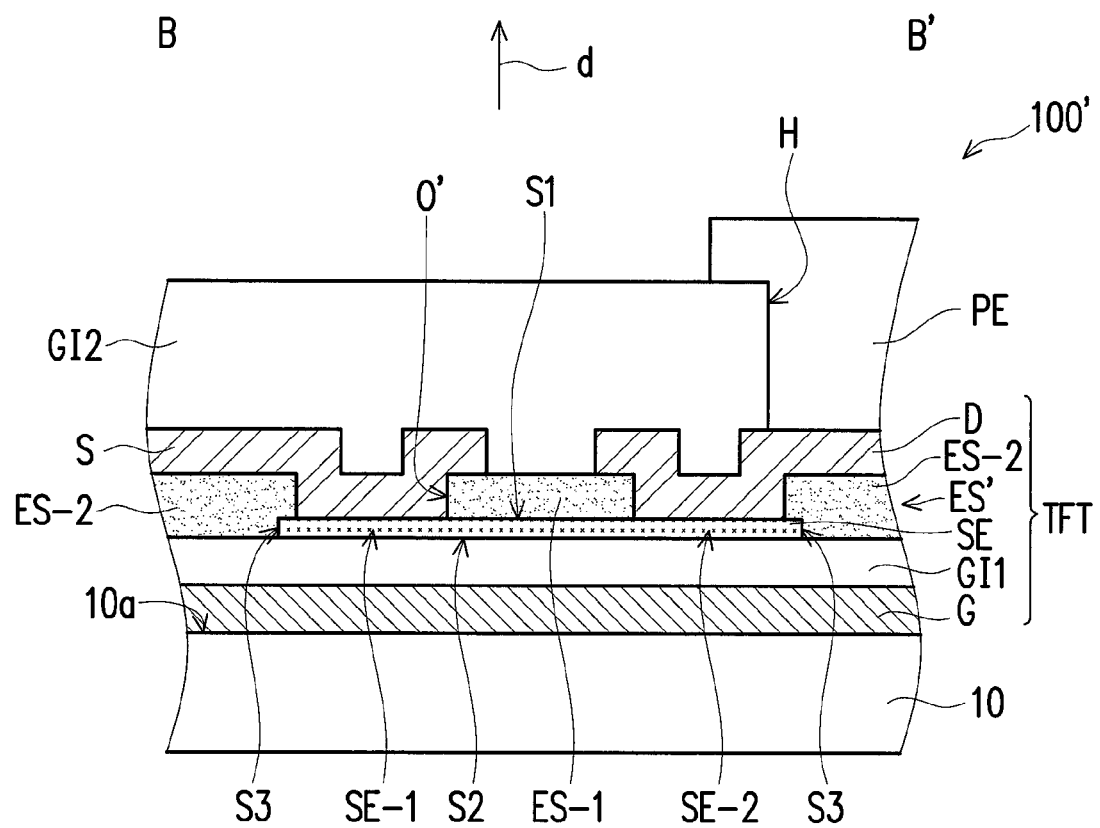
FIG. 3B is a schematic cross-sectional view corresponding to a cutting line B-B' of the pixel structure of FIG. 3A.

FIG. 3A is a schematic top view of a pixel structure according to another embodiment of the invention. FIG. 3B is a schematic cross-sectional view corresponding to a cutting line B-B' of the pixel structure of FIG. 3A. It should be noted that for the sake of clarity, a substrate 10 in FIG. 3B is not illustrated in FIG. 3A. Referring to FIGS. 3A and 3B, a pixel structure 100' of FIGS. 3A and 3B is similar to the pixel structure 100 of FIGS. 1F and 2F, and therefore similar or corresponding elements are represented by the same or corresponding reference numerals. The main difference between the pixel structure 100' and the pixel structure 100 lies in: relative positions between the ring-shaped hole O the corresponding channel SE and between a ring-shaped hole O' and the corresponding channel SE are slightly different. Descriptions about this difference are provided below, and similarities therebetween are not repeated again.

The pixel structure 100' is arranged on the substrate 10. The pixel structure 100' includes a thin film transistor TFT and a pixel electrode PE electrically connected to a drain D of the thin film transistor TFT. The thin film transistor TFT includes a gate G, a channel SE, a stopper layer ES', a source S and the drain D. The gate G is arranged on the substrate 10. The channel SE is arranged on the gate G. The stopper layer ES' covers a portion of the channel SE and has a ring-shaped hole O'. The ring-shaped hole O' exposes two opposite connecting portions SE-1 and SE-2 of the channel SE. The source S and the drain D are filled in the ring-shaped hole O' and electrically connected to the two connecting portions SE-1 and SE-2 of the channel SE.

Different from the pixel structure 100, in the pixel structure 100', the ring-shaped hole O' of the stopper layer ES' may not expose a side surface S3 of the channel SE. More specifically, a first stopper pattern ES-1 of the stopper layer ES' covers a portion of a top surface S1 of the channel SE. A second stopper pattern ES-2 surrounding the first stopper pattern ES-1 and separated from the first stopper pattern ES-1 covers another portion of the top surface S1 and the side surface S3 of the channel SE. The first stopper pattern ES-1 and the second stopper pattern ES-2 expose yet another portion of the top surface S1 of the channel SE together. When the source S and the drain D are filled in the ring-shaped hole O', the source S and the drain D contact with yet another portion of the channel SE without contacting with the side surface S3 of the channel SE.

In view of the above, unlike a nearly-complete coverage stopper layer in conventional art that uses two independent contact holes to serve as contact holes between the source and the channel and between the drain and the channel respectively, the stopper layer in the thin film transistor and the pixel electrode of the embodiment of the invention uses one single ring-shaped hole to serve as the contact hole between the source and the channel and between the drain and the channel simultaneously. In other words, compared with the nearly-complete coverage stopper layer in the conventional art, the number of contact holes (i.e. the ring-shaped holes) used in the thin film transistor and the pixel electrode of an embodiment of the invention is less, so that not too much area needs to be reserved in the channel for disposing the contact holes. Thereby, the area occupied by the thin film transistor and the pixel structure is reduced obviously.

On the other hand, since the stopper layer uses one single ring-shaped hole to serve as the contact hole between the source and the channel and between the drain and the channel simultaneously, in the process of etching an insulated layer to form the stopper layer, the intended stopper layer is formed by removing a small area of the insulated layer (i.e. the area of the insulated layer corresponding to the ring-shaped hole) without removing a large area of the insulated layer, so that the processing time for forming the stopper layer is short and the problem that the whole insulated layer is removed does not easily happen compared with an island-coverage stopper layer in the conventional art. To sum up, via the design of the ring-shaped hole of the stopper layer, the thin film transistor and the pixel structure in an embodiment of the invention have both advantages of small area and high yield rate in the fabricating process.

Although the invention has been described with reference to the embodiments thereof, it will be apparent to one of the ordinary skills in the art that variations and modifications to the described embodiments may be made without departing from the spirit and scope of the invention. Accordingly, the scope of the invention will be defined by the attached claims, not by the above detailed description.

What is claimed is:

1. A thin film transistor, arranged on a substrate, the thin film transistor comprising:
    a gate;
    a channel, overlapping with the gate;
    a stopper layer, covering a portion of the channel and having a ring-shaped hole exposing two opposite connecting portions of the channel, wherein the channel has a top surface facing the stopper layer and parallel to the substrate, a bottom surface opposite from the top surface and parallel to the substrate and a side surface disposed between the top surface and the bottom surface, the ring-shaped hole of the stopper layer exposing the side surface of the channel;
    a source and a drain, wherein a portion of the stopper layer is disposed between the source and the channel and between the drain and the channel, and the source and the drain are filled in the ring-shape hole of the stopper layer and electrically connected to the connecting portions of the channel respectively, and the source and the drain contacting with the side surface of the channel.

2. The thin film transistor according to claim 1, wherein the stopper layer comprises:
    a first stopper pattern, overlapping with the gate and the channel; and
    a second stopper pattern, surrounding the first stopper pattern, wherein the first stopper pattern and the second stopper pattern are separated to define the ring-shaped hole.

3. The thin film transistor according to claim 2, wherein the source and the drain extend from the second stopper pattern onto the first stopper pattern.

4. The thin film transistor according to claim 1, wherein the ring-shaped hole comprises a rectangular-shaped hole.

5. The thin film transistor according to claim 1, wherein the material of the channel comprises an amorphous silicon or a metal oxide semiconductor.

6. A pixel structure, arranged on a substrate, the pixel structure comprising:
    a thin film transistor, comprising:
        a gate;
        a channel, overlapping with the gate;
        a stopper layer, covering a portion of the channel and having a ring-shaped hole exposing two opposite connecting portions of the channel, wherein the channel has a top surface facing the stopper layer and parallel to the substrate, a bottom surface opposite from the top surface and parallel to the substrate and a side surface disposed between the top surface and the bottom surface, the ring-shaped hole of the stopper layer exposing the side surface of the channel;
        a source and a drain, wherein a portion of the stopper layer is disposed between the source and the channel and between the drain and the channel, and the source and the drain are filled in the ring-shape hole of the stopper layer and electrically connected to the connecting portions of the channel respectively, and the source and the drain contacting with the side surface of the channel; and
    a pixel electrode, electrically connected to the drain of the thin film transistor.

7. The pixel structure according to claim 6, wherein the stopper layer comprises:
    a first stopper pattern, overlapping with the gate and the channel; and
    a second stopper pattern, surrounding the first stopper pattern, wherein the first stopper pattern and the second stopper pattern are separated to define the ring-shaped hole, and the second stopper pattern overlaps with the pixel electrode.

* * * * *